United States Patent [19]

Ramet

[11] Patent Number: 4,914,440
[45] Date of Patent: Apr. 3, 1990

[54] ADJUSTABLE CURRENT SOURCE AND DIGITAL/ANALOG CONVERTER WITH AUTOCALIBRATION USING SUCH A SOURCE

[75] Inventor: Serge Ramet, Grenoble, France

[73] Assignee: SGS-Thomson Microelectronics S.A., Gentilly, France

[21] Appl. No.: 246,853

[22] Filed: Sep. 20, 1988

[30] Foreign Application Priority Data

Sep. 21, 1987 [FR] France .................. 87 13332

[51] Int. Cl.[4] .............................................. H03M 1/66
[52] U.S. Cl. ..................................... 341/140; 341/144; 307/296.1; 323/226
[58] Field of Search ............... 341/127, 135, 140, 153, 341/154, 144; 307/296.1, 270; 323/230, 226

[56] References Cited

U.S. PATENT DOCUMENTS

| | | |
|---|---|---|
| 3,826,970 | 7/1974 | Oka et al. |
| 3,940,760 | 2/1976 | Brokaw ............................. 341/119 |
| 4,166,962 | 9/1979 | Woodward. |
| 4,241,315 | 12/1980 | Patterson et al. .................... 323/315 |
| 4,251,743 | 2/1981 | Hareyama ........................ 307/296.1 |
| 4,549,166 | 10/1985 | Hotta et al. |
| 4,573,005 | 2/1986 | van de Plassche ................ 341/135 |
| 4,587,477 | 5/1986 | Hornak et al. ....................... 341/144 |
| 4,639,617 | 1/1987 | Glakoumis ........................ 307/296.1 |
| 4,646,002 | 2/1987 | Tuszyski ........................... 307/296.1 |
| 4,701,694 | 10/1987 | Penney et al. ....................... 341/144 |
| 4,730,123 | 3/1988 | Wegener et al. .................... 307/207 |

OTHER PUBLICATIONS

H. P. von Ow, "Reducing Distortion in Controlled Attenuators Using FET" Procedings of the IEEE, 1968, pp. 1718, 1719.

"Operational Amplifier Design Techniques", Jacob Millman, Microelectronics, 1979, pp. 535–540.

Primary Examiner—William M. Shoop, Jr.
Assistant Examiner—G. Romano
Attorney, Agent, or Firm—Lowe, Price, LeBlanc, Becker & Shur

[57] ABSTRACT

An adjustable current source comprising a bipolar transistor (BT), the base of which receives a signal adapted to approximately set the current which flows therethrough, and a MOS transistor (MT), in series with the bipolar transistor, the gate (G) of which receives an adjustment signal stored by a capacitor (C) connected between its gate and its drain. This current source can be used for forming the upper stages of an auto-calibration digital converter.

4 Claims, 4 Drawing Sheets

ADJUSTABLE CURRENT SOURCE AND DIGITAL/ANALOG CONVERTER WITH AUTOCALIBRATION USING SUCH A SOURCE

BACKGROUND OF THE INVENTION

The instant invention relates to current sources accurately adjustable by a voltage and more particularly the implementation of such current sources to digital-/analog converters with high precision auto-calibration, for example of 12 bits, In the prior art, in order to obtain digital/analog converters having a high precision and a great linearity, bipolar transistors associated with networks R-2R are used to form a set of switchable current sources, the values of which, with respect to the value of a reference current, form a geometric progression with a ratio 2. However, due to the manufacturing dispersions which impair the resistivity of the networks R-2R and of the bipolar transistors, it is compulsory, as soon as the number of bits of the digital/analog converter is over 7 or 8, to carry out a laser trimming of the resistors of the networks R-2R if a very high linearity is required. In the prior art, in order to obtain digital/analog converters having a high precision and a high linearity, without having to resort to the laser trimming of any component of the converter, various types of auto-calibration digital/analog converters, the adjustable components of which are capacitors, have been proposed; said capacitors belonging to a set of capacitors, the capacitances of which are referred to the capacitance of a unitary capacitor, form a geometric progression with a ratio 2.

An object of the instant invention is to provide for a simple current source, adjustable with a particularly high accuracy.

Another object of the instant invention is to provide for a digital/analog converter adjustable in an accurate way, making use of an adjustable current source and being therefore capable of comprising a large number of cells.

A further object of the instant invention is to provide for such a digital/analog converter particularly simple to manufacture and accurate when operating.

SUMMARY OF THE INVENTION

Those objects, features, advantages and others of the instant invention are achieved by providing an adjustable current source comprising a bipolar transistor, the base of which receives a signal adapted to approximately set the current which flows therethrough, and a MOS transistor, in series with the biPolar transistor, the gate of which receives an adjustment signal stored by a capacitor connected between its gate and its drain.

Preferably, the bipolar transistor is a NPN transistor and the MOS transistor an enhanced P-channel transistor, the source of the MOS transistor being connected with a high voltage, its drain being connected with the collector of the bipolar transistor and the emitter of the bipolar transistor being connected with a low voltage source.

Preferably, the adjustment signal originates from a current amplifier supplying an error signal resulting from the comparison between said current source and a reference current source.

A digital/analog converter according to the invention is so designed that its stages corresponding to the bits of the lower rank comprise conventional current sources and each of its stages corresponding to the bits of the upper rank comprises a current source according to the instant invention.

This digital/analog converter comprises switching and amplifying means for periodically comparing the current in each of the current sources corresponding to the bits of the upper rank with the sum of the currents of the current sources of the lower rank bits and for accordingly adjusting the current in said current sources corresponding to the bits of upper rank.

BRIEF DESCRIPTION OF THE DRAWINGS

Other objects, advantages and features of the instant invention will clearly appear from the following detailed description of preferred embodiments, in connection with the attached drawings, wherein.

DETAILED DESCRIPTION OF THE DRAWINGS

Figure 1:
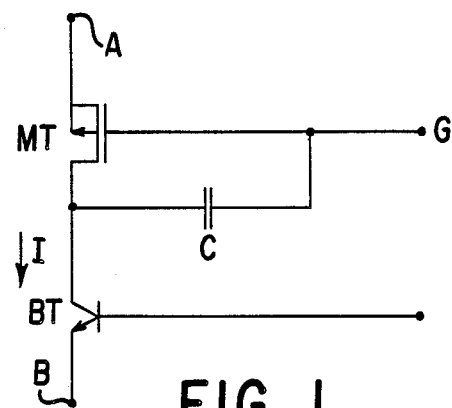
FIG. 1 schematically shows an adjustable current source according to the instant invention.

FIG. 1 shows a voltage-adjustable current source according to the invention. This current source is designed to let a chosen current I flow and is connected between a high voltage terminal A and a low voltage terminal B through non shown circuits. It essentially comprises a bipolar transistor BT in series with a MOS transistor MT. In the given example, the bipolar transistor BT is a NPN transistor, the emitter of which is connected with the terminal B and the collector of which is connected with the drain of transistor MT, which is an enhanced P-channel transistor. The source of transistor MT is connected with terminal A. The gate of transistor MT is connected with its drain through a storing capacitor C.

Normally, a conventional current source only comprises the bipolar transistor BT, the base of which receives an appropriate biasing voltage, in relation with the values of the high and low voltages for setting the current in the bipolar transistor. In fact, on account of the manufacturing dispersions, the wished current value can never be precisely attained.

Figure 2:
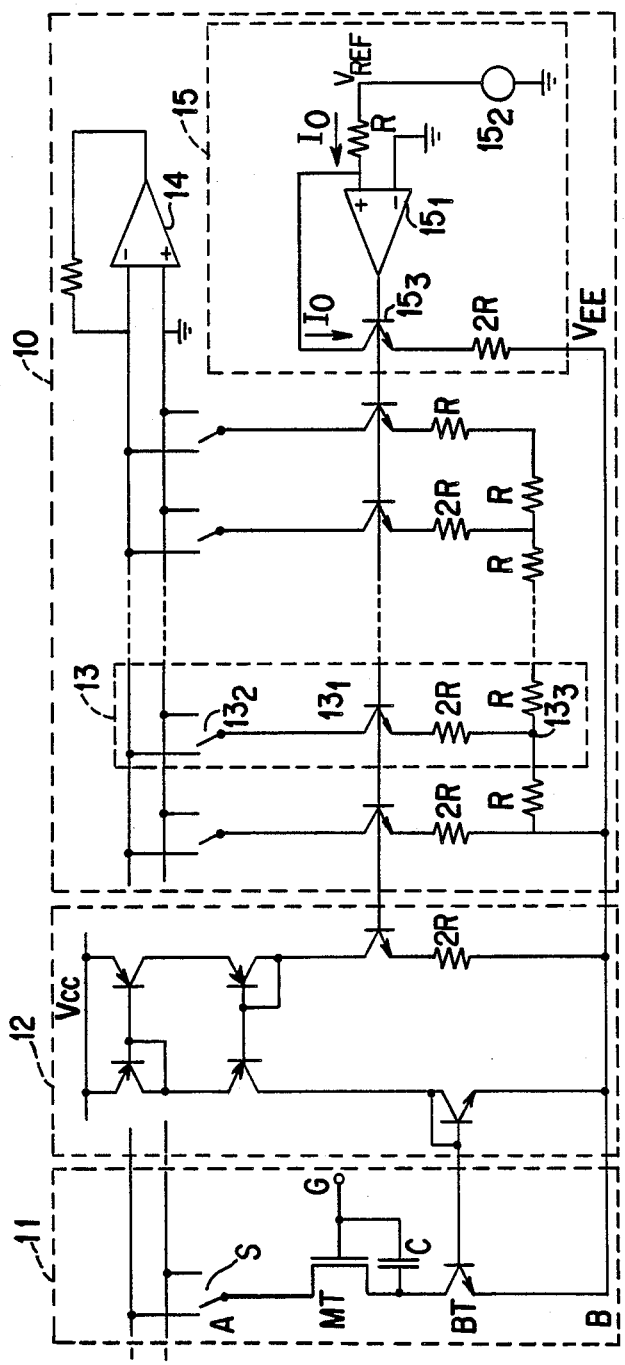
FIG. 2 schematically shows a digital/analog converter according to the instant invention.

According to the invention, the MOS transistor MT in series with the bipolar transistor BT permits to obtain a very accurate adjustment by slightly modifying the collector/emitter voltage of the bipolar transistor BT. This adjustment is carried out by acting on the gate G of the MOS transistor. It will be noted that the influence of the adjustment is all the more well defined as the impedance between !he emitter of transistor BT and the low voltage terminal B is weak. Moreover, according to the invention, the gate voltage applied onto the MOS transistor is stored by a capacitor C. Therefore, it is possible to periodically act only upon the gate of transistor MT, the adjustment value being stored in capacitor C during the non-calibration periods FIG. 2 shows an embodiment of a digital/analog converter according to the invention. In this figure, the block 10 shows a conventional digital/analog converter, the block 11 shows an additional stage of the converter according to the invention and the block 12 shows an examplary biasing stage for the block 11.

A cell of the conventional digital/analog converter 10 is shown in a box 13. This cell comprises a bipolar transistor $13_1$, the collector of which is connected by a switch $13_2$ with the input plus (+) or with the input minus (−) of a differential amplifier 14. The emitter of transistor $13_1$ is connected with a junction $13_3$ through a resistor 2R and this junction is connected with the resistors 2R of the adjacent cells through resistors having a value R. In each cell, transistor $13_1$ has its emitter surface corresponding to the rank of the bit converted by this cell and switch $13_2$ is connected with the input (−) or with the input (+) of the amplifier 14 depending on whether said bit has a bit value "1" or "0". The base of transistor $13_1$ is biased by means of a circuit 15 comprising a differential amplifier $15_1$, a first input (−) of which is grounded and the second input (+) is connected with a reference voltage source $15_2$ through a resistor R. This second input (+) of the differential amplifier $15_1$ is connected with the collector of a bipolar transistor $15_3$, the emitter of which is connected with a low supply voltage VEE through a resistor 2R and the base of which is connected with the output of amplifier $15_1$. The current IO flowing in transistor $15_3$, and therefore its base voltage, are thus set. This base voltage is applied to the bases of all the transistors $13_1$ which will then allow the currents proportional to the current IO to flow, in accordance with the bit weight of the corresponding cell. In this block 10, the first two cells are cells with identical transistors which let the current corresponding to the lowest bit weight flow. It will be noted that the first of those two first cells comprises a resistor having a value R and not a value 2R in series with its transistor.

The block 11 designates the cell of the digital/analog converter corresponding to the bit with a rank immediately above the last cell of block 10, for example to the eighth bit if the digital/analog converter of block 10 is a seven bit-converter. One block 11 only has been shown here, but it will be admitted that for implementing a converter with a large number of bits several cells similar to those of block 11 will be used. In this block 11, the bipolar transistor BT, the MOS transistor MT and the capacitor C of FIG. 1 are shown again. The terminal B of FIG. 1 is connected with the voltage supply VEE and the terminal A of FIG. 1 is connected with a switch S permitting the connection of the cell according to the invention with either input of the differential amplifier of output 14.

A circuit for biasing the base of the bipolar transistor BT has also been shown on FIG. 2 in the block 12. As it is apparent on the figure, this circuit essentially comprises current mirrors and is designed to bias the transistor BT in such a way that the value of its collector current be as close as possible to twice the current value of the current corresponding to the bit having the higher weight in block 10. This circuit 12 permits to get rid from the fact there is no resistor 2R in series between the emitter of the bipolar transistor BT and the low voltage VEE.

It will be noted that the converter of Pig. 2 is only intended to make the instant invention clearly understood and to explain a conversion method compatible with the use of cells according to the instant invention. It should be kept in mind that the real implementation of a converter requires the use of a more complex circuitry which will not be disclosed here for the sake of simplicity.

Figure 3:
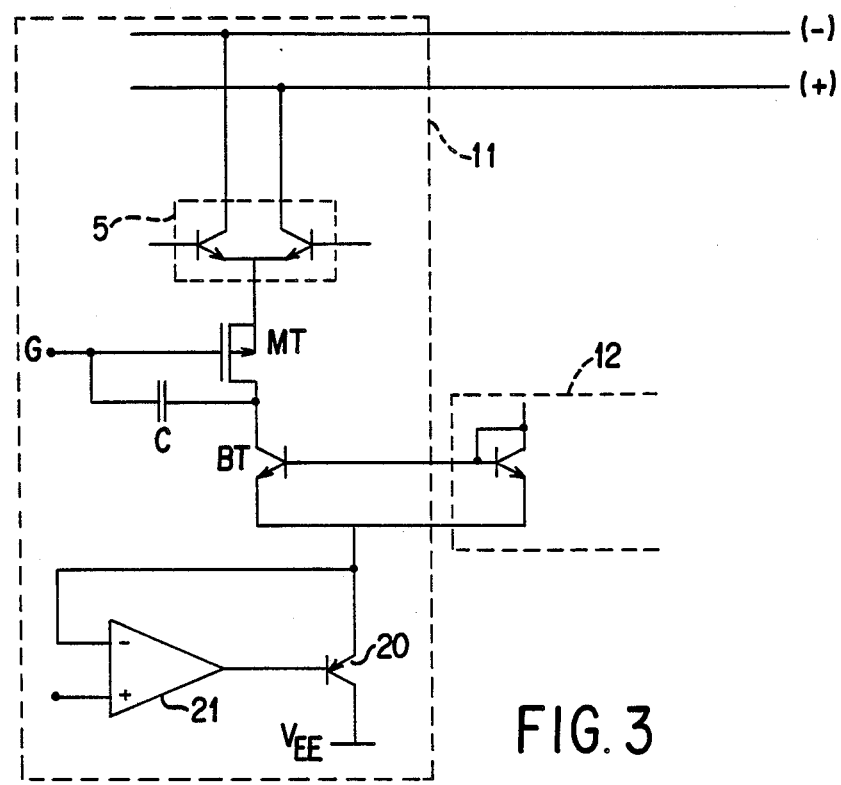
FIG. 3 schematically shows a connection variation of the current source according to the instant invention in a digital/analog converter.

FIG. 3 shows only by way of example a more detailed possible implementation of a cell 11 according to the invention. The MOS transistor MT, its gate terminal G, the capacitor C and the transistor BT are shown again on this FIG. 3. The transistor BT is operating as a current mirror with an unreferenced transistor which is part of the block 12 of FIG. 2. Conventionally, the switch S is implemented by means of a pair of NPN transistors, the bases of which receive the signal corresponding to the bit value of cell 11 and its complementary signal.

In this FIG. 3, the main feature is that the emitter of transistor BT instead of being direct)y connected with the low voltage VEE is connected with this voltage source through a PNP vertical bipolar transistor 20, the emitter of which is connected with the emitter of transistor BT and the collector of which is coupled with the low voltage VEE. The voltage on the emitter of this transistor is set by a servo-control comprising an amplifier 21, a first input (+) of which receives a reference voltage, the second input (−) of which is coupled with the emitter of transistor 20 and the output of which is coupled with the base of this transistor. This circuit permits to get rid from the possible fluctuations of the low voltage VEE. This is just one example among the various improvements that can be brought to the device.

Figure 4:
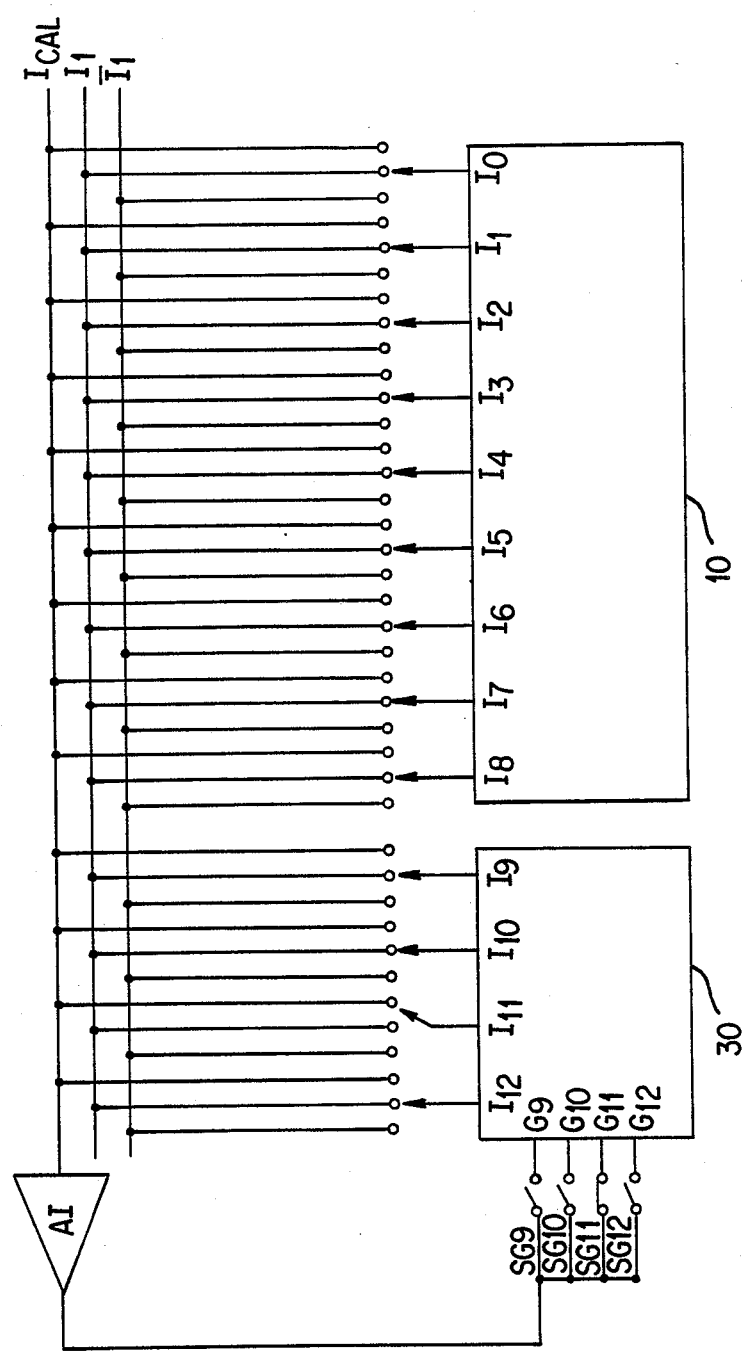
FIG. 4 illustrates the calibration process according to the instant invention.

FIG. 4 shows an examplary embodiment of the calibration method according to the invention. FIG. 4 shows again the block 10 of FIG. 2 corresponding to a digital/analog converter supplying the currents I0 to I8, the current I0 being equal to the current I1, the current I1 corresponding to the least significant bit and the current I8 corresponding to the most significant bit. Therefore, each of the cells can be connected with an input $I_{CAL}$ of a current differential amplifier with a sequential operation AI.

Block 30 comprises cells of the type of cell 11 shown on FIG. 2. Four bits supplying the currents I9 to I12 corresponding to the four most significant bits to be converted are shown. This block also comprises inputs G9 to G12 corresponding to the gates of the MOS transistors of the respective cells supplying the currents I9 to I12. On this figure, the connections are shown as being those corresponding to the calibration of the cell supplying the current I11. The output of amplifier A1 is connected through a switch SG11 with the gate G11 of the MOS transistor which permits to calibrate the current I11.

During a first phase (not shown), the currents I0 to I10 are applied to the input $I_{CAL}$ and the corresponding value is stored by the amplifier A1. During a second phase, corresponding to the connections of FIG. 4, the current I11 is applied to the input of the amplifier AI and is compared with the stored value. The error signal at the output of the amplifier AI is applied onto the gate G11 for reducing the current I11 to a value equal to the sum of the currents I0 to I10.

The accuracy of the servo-control depends then only upon the gain of the amplifier AI and upon the possible offset of this amplifier.

Figure 5:
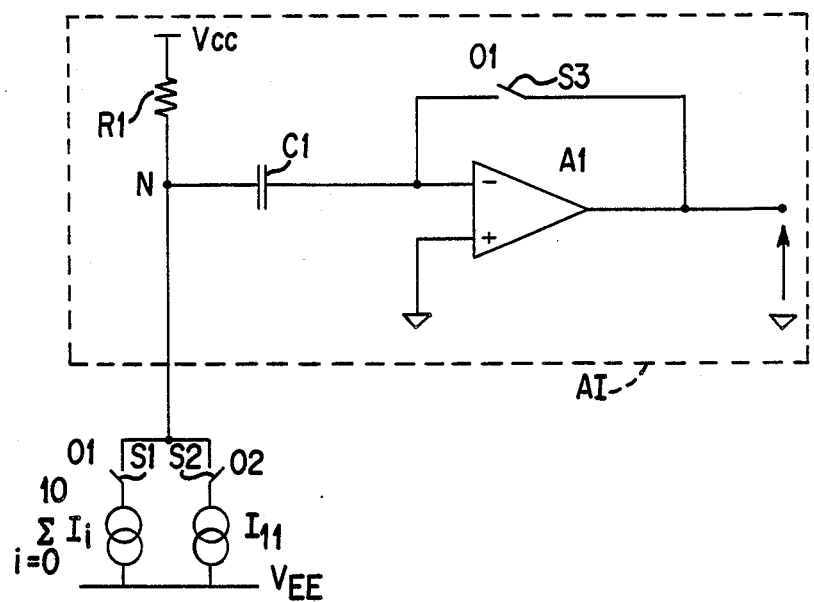
FIG. 5 shows an examplary current amplifier operating in the sequential mode that can be used during the calibration phase.

An examplary circuit of a current amplifiercomparator with sequential function is illustrated on FIG. 5. The amplifier AI comprises a differential amplifier A1, the first input (+) of which is grounded, the second input (−) of which is connected with a junction N by means of a capacitor C1 and the input of which is connected with the output by means of a switch S3. The junction N is coupled with the positive supply source VCC through a resistor R1 and can be connected by switches S1 and S2 with one or other of the current sources $I_{REF}$ ($I_{REF}$ being equal to the sum of the currents $I_0$ to $I_{10}$) and $I_{11}$, in the given example, by switches S1 and S2. The switches S1 and S3 are simultaneously closed during a first phase Φ1 and the switch S2 is closed during a second phase Φ2 during which the switches S1 and S3 are open.

Thus, during the phase Φ1, the capacitor C1 is loaded with the voltage VCC - $R1I_{REF}$ - $V_{os}$, $V_{os}$ being the offset voltage of the amplifier A1. Therefore, during the second phase Φ2, a signal corresponding to $RI(I_{11} - I_{REF})$ with an offset compensation is obtained at the output of amplifier A1.

What is claimed:

1. An adjustable current source comprising a bipolar transistor, the base of which receives a signal adapted to approximately set the current which flows therethrough, further comprising a MOS transistor, in series with said bipolar transistor, the gate of which receives an adjustment signal stored by a capacitor connected between its gate and its drain,
    wherein said bipolar transistor is a NPN transistor and said MOS transistor is an enhanced P-channel transistor, the source of the MOS transistor being connected with a high voltage, its drain being connected with the collector of the bipolar transistor and the emitter of the bipolar transistor being connected with a low voltage source.

2. An adjustable current source according to claim 1, wherein said adjustment signal originates from a current amplifier supplying an error signal resulting from the comparison between said current source and a reference current source.

3. A digital/analog converter comprising stages each having a current source, said stages corresponding to lower rank bits and higher rank bits, wherein each of said stages corresponding to higher rank bits includes,
    an adjustable current source comprising a bipolar transistor, the base of which receives a signal adapted to approximately set the current which flows therethrough, further comprising a MOS transistor, in series with said bipolar transistor, the gate of which receives an adjustment signal stored by a capacitor connected between its gate and its drain,
    wherein said bipolar transistor is a NPN transistor and said MOS transistor is an enhanced P-channel transistor, the source of the MOS transistor being connected with a high voltage, its drain being connected with the collector of the bipolar transistor and the emitter of the bipolar transistor being connected with a low voltage source.

4. A digital/analog converter according to claim 3, comprising switching and amplifying means for periodically comparing the current in each of the current sources corresponding to the higher rank bits with the sum of the currents of the lower rank bits current sources and for accordingly adjusting the current in said current sources corresponding to the higher rank bits.

* * * * *